United States Patent [19]

Blenman

[11] 4,233,560
[45] Nov. 11, 1980

[54] ELECTRICAL APPARATUS FOR TESTING VOLTAGE, POLARITY AND CONTINUITY

[76] Inventor: Orman L. Blenman, 69 Drexel Rd., Buffalo, N.Y. 14214

[21] Appl. No.: 936,351

[22] Filed: Aug. 24, 1978

[51] Int. Cl.³ .................... G01R 19/14; G01R 31/02
[52] U.S. Cl. ................................ 324/133; 324/51
[58] Field of Search .............. 324/51, 53, 133, 149, 324/72.5, 72, 122; 340/660–663

[56] References Cited

U.S. PATENT DOCUMENTS

| 3,553,572 | 1/1971 | Harmon | 324/53 |
| 3,600,678 | 8/1971 | Garrett | 324/133 |
| 3,735,248 | 5/1973 | Reese | 324/51 |
| 3,806,803 | 4/1974 | Hall | 324/133 |
| 3,872,384 | 3/1975 | Laass | 324/133 X |
| 4,027,236 | 5/1977 | Stewart | 324/51 |

FOREIGN PATENT DOCUMENTS

| 1407867 | 6/1965 | France | 324/51 |
| 1268183 | 3/1972 | United Kingdom | 324/133 |
| 1467229 | 3/1977 | United Kingdom | 324/133 |

*Primary Examiner*—Gerard R. Strecker
*Attorney, Agent, or Firm*—Christel, Bean & Linihan

[57] ABSTRACT

Electrical testing apparatus comprising a pair of input probe terminals, a multi-position mode selection switch, a source of direct voltage, an NPN transistor and a PNP transistor, and a pair of light-emitting diodes each connected in the collector-emitter circuit of a corresponding transistor and poled for conduction when the corresponding transistor is on. In one position of the switch connecting one of the input terminals to both bases of the transistors, an alternating voltage between the input terminals is indicated by both of the light-emitting diodes being energized, and a direct voltage between the input terminals is indicated by only one of the light-emitting diodes being energized, the particular one being determined by the polarity of the direct voltage. In either of two other positions of the switch connecting one of the input terminals to either of the light-emitting diodes, if a closed circuit exists between the input terminals one of the light-emitting diodes is energized depending upon the polarity, and if an open circuit exists neither diode is energized.

8 Claims, 2 Drawing Figures

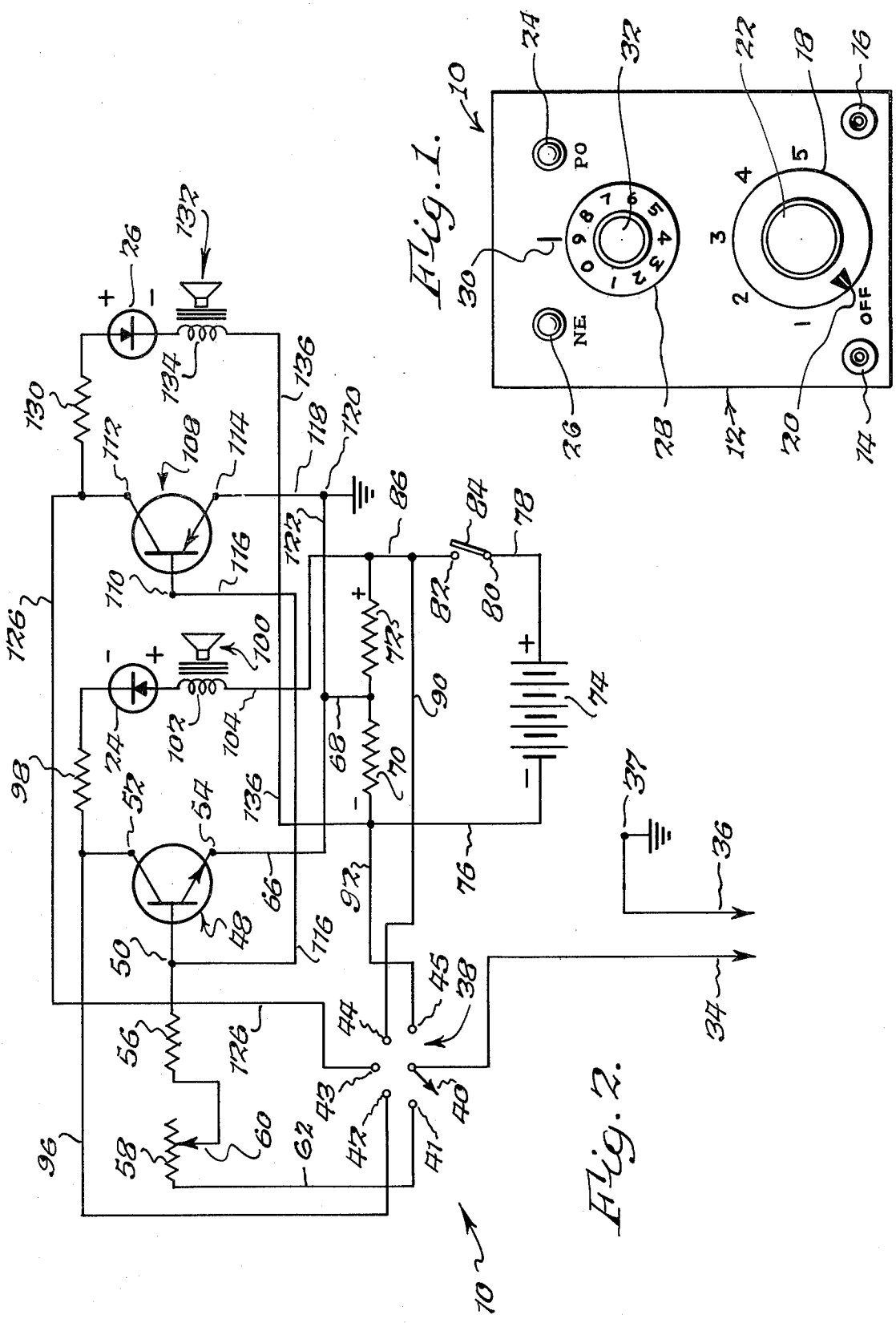

ELECTRICAL APPARATUS FOR TESTING VOLTAGE, POLARITY AND CONTINUITY

BACKGROUND OF THE INVENTION

This invention relates to the art of electrical testing apparatus, and more particularly to a new and improved apparatus for testing electrical voltage, polarity and continuity.

Various types of electrical testing apparatus have been proposed and patented. It would be highly desirable to provide, in a single compact apparatus, the capability of selectively testing for alternating or direct voltage, the polarity if the voltage is direct, electrical continuity, and polarity if continuity exists. It also would be desirable to provide such apparatus which is operable over a wide range of voltages and is relatively simple in construction, easy to use and effective in operation.

SUMMARY OF THE INVENTION

It is, therefore, a primary object of this invention to provide a new and improved apparatus for testing electrical voltage, polarity and continuity.

It is a more particular object of this invention to provide such apparatus which distinguishes between alternating and direct voltages and provides indications of the difference and also of the polarity if the voltage is direct.

It is a more particular object of this invention to provide such apparatus which indicates whether or not continuity exists and if so the relative electrical polarity.

It is a further object of this invention to provide such apparatus which is operable over a wide range of voltages.

It is a further object of this invention to provide such apparatus which is relatively simple in construction so as to be small in size and light in weight and which is portable.

It is a further object of this invention to provide such apparatus which is efficient and effective in operation and convenient and easy to use.

The present invention provides electrical testing apparatus comprising a pair of input probe terminals adopted to be connected to two points to be tested, a multi-position mode selection switch, a source of direct voltage, first and second semiconductor switching means, and first and second visual indicating means each in the form of a light-emitting diode and each connected so as to be energized when a corresponding one of the semiconductor switching means is turned on. In one position of the switch connecting one of the input probe terminals to both control terminals of the semiconductor switches, an alternating voltage between the test points connected to the input terminals is indicated by energization of both of the light-emitting diodes and a direct voltage between the test points is indicated by energization of only one of the diodes, the particular one depending on the polarity of the direct voltage. In either of two other positions of the switch connecting one of the input terminals to either of the light-emitting diodes, if a closed circuit exists between the test points connected to the input terminals one of the light-emitting diodes is energized, the particular one depending upon the polarity, and if an open circuit exists neither diode is energized.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 1 is an end elevational view of electrical testing apparatus of the present invention; and FIG. 2 is a schematic circuit diagram of electrical testing apparatus of the present invention.

BRIEF DESCRIPTION OF THE ILLUSTRATED EMBODIMENT

The apparatus for testing electrical voltage, polarity, and continuity according to the present invention is generally designated 10 and, as shown in FIG. 1, is incorporated in a housing 12 which preferably is rectangular in shape. A pair of fittings 14,16 are provided at the lower portion of the front face of housing 12 as viewed in FIG. 1, adjacent each corner, through which electrical leads extend from external probe input terminals which are connected to points between which tests are to be made. Alternatively, the fittings designated 14,16 could be conventional jack-type connectors whereby external leads could be plugged into the jacks which, in turn, would be connected to points in circuitry contained within housing 12. A manually-operated selector dial 18 is rotatably connected to the front face of housing 12 and is provided with a pointer designated 20 and a knob 22. Manipulation of knob 22 causes dial 18 to turn pointer 20 to various locations indicated by numerals 1–5 provided on the face of the housing. A shaft or other mechanical connection from dial 18 is operatively connected to a mode selector switch within the housing 12 in a manner which will be described.

Adjacent the upper portion of the front surface of housing 12 as viewed in FIG. 1 are a pair of visual indicator elements in the form of light-emitting diodes 24,26 which have glass or transparent plastic bulb-like protective housings which are mounted in the front face of housing 12 and extend outwardly therefrom. In the device shown, the indicator 26 when energized indicates negative electrical polarity and is provided with the indicia NE. Similarly, the indicator 24 when energized indicates positive electrical polarity and is provided with the indicia PO. The apparatus further comprises a voltage sensitivity or range control in the form of a dial 28 having numerical range indicia thereon and associated with a pointer 30 on the surface of housing 12. Dial 28 is manually operated by a knob 32 associated therewith. A shaft or similar mechanical connection between extends from dial 28 to a potentiometer or variable resistance within housing 12 in a manner which will be described.

Referring now to the circuit shown in FIG. 2, the apparatus of the present invention comprises a pair of input probe terminals 34,36 adapted to be connected to two points either having a voltage therebetween to be tested or between which the continuity is to be tested. One of the input probe terminals, in the device shown the terminal 36, is connected to an electrical ground or reference terminal 37 of the apparatus.

The other input probe terminal 34 is connected to a mode selector switch 38 including a switch arm 40 which is movable into and out of electrical contact with a plurality of switch contact elements 41–45. In particular, terminal 34 is connected to arm 40. Movement of switch arm 40 is provided in response to movement of the dial 18 shown in FIG. 1. In other words, a mechanical connection or coupling is provided between the dial 18 and the switch arm 40 whereby as dial 18 is rotated to move pointer 20 selectively in registry or alignment with the positions designated 1-5 in FIG. 1, switch arm 40 is moved selectively into engagement with the switch contacts 41-45 shown in FIG. 2. The position of switch arm 20 in FIG. 2 corresponds to the off position illustrated for the dial 18 in FIG. 1. The five switch contacts 41-45 correspond to the five switch positions designated 1-5, respectively, in FIG. 1. The switch contacts 41-45 in turn, are connected to various portions of the circuit in a manner which now will be described.

The apparatus of the present invention further comprises first semiconductor switching means in the form of an NPN transistor 48 having base, collector and emitter terminals 50,52 and 54, respectively. Base terminal 50 is connected to one terminal of a first voltage dropping resistor 56, the other terminal of which is connected to a potentiometer 58, in particular to the wiper 60 thereof. The potentiometer 58 also is connected by a lead 62 to the switch contact 41. The emitter terminal 54 of transistor 48 is connected by a line 66 to a lead 68 connected to the junction of a pair of series-connected, voltage-dropping resistors 70 and 72 associated with a source of direct voltage. The source includes a battery 74 having a negative terminal connected by a line 76 to one terminal of resistor 70. The positive terminal of battery 74 is connected by a line 78 to a switch contact 80 associated with a second contact 82, the two contacts being connected and disconnected by means of a switch arm 84. Switch contact 82 is connected by a line 86 to the other terminal of resistor 72. Thus, the junction of line 76 and the terminal of resistor 70 is a relatively negative terminal or point of the voltage source, and the junction of line 86 and the terminal of resistor 72 is a relatively positive point or terminal of the voltage source. The junction of the voltage dropping resistors 70,72 is connected by lead 68 also to the circuit ground or reference terminal in a manner which will be described.

The junction of lead 86 and the terminal of resistor 72 also is connected by a line 90 to the switch contact 44 of the selector switch 38. The junction of line 76 and the terminal of resistor 70 is connected by a line 92 to the switch contact 45 of the selector switch 38. The collector terminal 52 of transistor 48 is connected by a line 96 to the contact 42 of selector switch 38. The collector terminal 52 also is connected to one terminal of a resistor 98, the other terminal of which is connected to the cathode of the light emitting diode 24. The anode of diode 24 is connected to the positive terminal of the voltage source, i.e. to the junction of line 86 and terminal of resistor 72. The connection can be direct or, as in the device shown, it can be through an electro-acoustical transducer means in the form of a speaker 100 having an energizing coil 102, one terminal of which is connected to the anode of diode 24 and the other terminal of which is connected by a line 104 to the junction of lead 86 and resistor 72.

The apparatus of the present invention further comprises a second semiconductor switching means in the form of a PNP transistor 108 having base, collector and emitter terminals 110,112 and 114, respectively. Base terminal 110 of transistor 108 is connected by a line 116 to base terminal 50 of transistor 48. The emitter terminal 114 of transistor 108 is connected by a line 118 to a circuit reference or ground terminal 120 which also is connected by a line 122 to a lead 68 extending from the combination of resistors 70,72 of the voltage source. Ground terminals 37 and 120 typically are interconnected. The collector terminal 112 of transistor 108 is connected by a line 126 to the switch contact 43 of the selector switch 38. The collector terminal also is connected to one terminal of a resistor 130, the other terminal of which is connected to the anode of light-emitting diode 26. The cathode of light-emitting diode 26 is connected to the relatively negative terminal of the voltage source, i.e. to the junction of line 76 and the terminal of resistor 70. This connection can be direct or as in the device shown can be through an electro-acoustical transducer in the form of a speaker 132 having an energizing coil 134, one terminal of which is connected to the cathode of diode 26 and the other terminal of which is connected by a line 136 to the junction of line 76 and resistor 70.

The apparatus of the present invention operates in the following manner. The switch arm 84 is moved from the open or off position shown in FIG. 2 to a closed position whereby contacts 80,82 are bridged or connected. The mode of operation of the apparatus is selected by the switch 38. This is done by rotating dial 18 by means of knob 22 to move the switch arm 40 from the off position shown in FIGS. 1 and 2 to a selected one of the positions numbered 1-5 in FIG. 1 corresponding to arm 40 engaging a selected one of the contacts 41-45. When dial 18 is moved so that pointer 20 is in alignment with number 1 on the housing whereby switch arm 40 engages contact 41, the apparatus functions to distinguish between an alternating voltage and a direct voltage and if the voltage is direct, to indicate the electrical polarity. In particular, the input probe terminals 34,36 are connected to two points, such as in an electrical circuit having a voltage therebetween which is to be tested. If the voltage between the points is alternating both of the light-emitting diodes 24,26 will be energized with the result that both light up which can be viewed on the front surface of housing 12. This is because on the positive half-cycle of the alternating voltage the transistor 48 is turned on thereby allowing current to flow through light-emitting diode 24 from the positive terminal of the voltage source through the collector-emitter path of transistor 48 to the reference terminal of the voltage source. On this same half-cycle transistor 108 is turned off. On the negative going half-cycle of the alternating voltage, transistor 48 is turned off but the negative voltage also is applied to the base of the transistor 108 causing it to turn on. This results in a flow of current through the light-emitting diode 26 energizing the same. In particular, a circuit is completed from the negative terminal of the voltage source through diode 26 through the collector-emitter path of transistor 108 to the reference terminal 120. Thus light-emitting diodes 24,26 are alternately turned on or energized at a frequency equal to that of the alternating voltage. If sixty c.p.s. line voltage or other relatively high voltage is being tested, the both light emitting diodes give the visual appearance of being constantly energized or illuminated.

On the other hand, if the voltage between the input probe terminals 34,36 is direct, only one of the light-emitting diodes 24,26 will be energized. For example, if the direct voltage is positive in polarity, this will turn on transistor 48 but not transistor 108 causing diode 24 to be energized but not diode 26. If the direct voltage is negative, the opposite situation occurs with diode 26 being energized and diode 24 being off. The range of voltage which can be tested is adjusted by means of the potentiometer 58. Manual control is provided by rotating the dial 28 by means of knob 32 such that pointer 30 is in alignment with a desired setting according to the reference numerals on dial 28. Thus the potentiometer 58 is set according to the magnitude of the voltage being tested. The voltage-dropping resistors 56, 58 serve to protect the light-emitting diodes 24,26 when the voltage being tested is relatively high. When the light-emitting diodes 24,26 are connected directly to the voltage source, i.e. when the transducers 100,132 are omitted, the only indication of the foregoing is visual. Providing the speakers 100,132 in the circuit gives an audible indication as well which can be of use in many situations.

The apparatus of the present invention is used for checking electrical continuity in the following manner. The switch arm 40 is moved to either contacts 42 or 43 depending upon the electrical polarity of the test points. This of course is effected by manual rotation of the dial 18 by means of knob 22 so that pointer 20 corresponds to either position 2 or 3 shown in FIG. 1. In this mode the apparatus can be used to check the continuity of wires or leads in which case the conduction is bidirectional, and it also can be used to check continuity of semiconductor devices and the like in which case the conduction is unidirectional. If the circuit being tested is a closed circuit between the points contacted by the input probe terminals 34,36, one of the light emitting diodes 24,26 will light up depending upon the electrical polarity. In addition, an audible indication also can be provided if the speakers 100,132 are connected in the circuit. If the circuit is open, on the other hand, neither of the light emitting diodes 24,26 will light up.

For example, in checking a semi-conductor device, if it is burned out or defective it will behave like a closed circuit in both directions. Therefore, the apparatus of the present invention allows for checking in both polarity modes because if in the position with switch arm 40 engaging contact 42 one of the light-emitting diodes, for example diode 24, will light up but when the switch is moved to the position engaging contact 43 the other does not light up. Then the operator of the apparatus would know that the semiconductor device still is good. The opposite occurs for opposite electrical polarity. In addition, the user of the apparatus can ascertain whether a three terminal, semi-conductor device is of the P or N type as well as determining the nature of the terminals, i.e. collector, emitter or base, simply by connecting the input probe terminals in question both ways and then examining the states of the light emitting diodes 24,26.

The apparatus of the present invention also can be used to test light-emitting diodes and similar devices. For this mode of operation the switch arm 40 is moved to either of the positions 44 or 45 by manipulating knob 22 to move dial 18 so that pointer 20 corresponds to positions 4 or 5 shown in FIG. 1. For example, with selector switch in the position with arm 40 engaging contact 44, and with the input probe terminals 34 and 36 connected across the light-emitting diode to be tested, if the diode lights up the user knows that the device is good and furthermore the electrical polarity can be determined. If the diode does not light up the selector switch is advanced to position 5, i.e. arm 40 is moved into engagement with contact 45, whereupon if the diode lights up the user knows it is good but that the electrical polarity is the opposite.

By way of example, in an illustrative device, resistor 56 has a magnitude of about 4.7 kilohms, potentiometer 58 has a magnitude of 50 kilohms, resistors 70 and 72 have magnitudes of one kilohm each, and resistors 98 and 130 have magnitudes of 30 ohms each. Transistors 48 and 108 are of the medium power type having a minimum reverse voltage of about 6 volts. The light emitting diodes 24,26 are of small size clear or in red color, and have a reverse voltage of 3 volts. The switch 38 is a singlepole, six position selector type switch, and switch 84 is a single pole, single throw miniature switch. The battery 74 provides a voltage of about 9 volts. The entire apparatus can be contained in a housing 12 having a height of about 4 inches, a width of about $2\frac{7}{8}$ inches and a thickness of about $1\frac{1}{2}$ inches. With the values given for the electrical components, the range of voltages which can be tested is from about 0.5 volts to about 600 volts AC or DC.

The apparatus of the present invention finds use in testing a number of electrical components and apparatus. For example, it can be used to test fuses, circuit breakers, light bulbs as well as testing for proper electrical grounding and testing home appliances. It also can be used to check transistors, diodes, light-emitting diodes and similar devices as described above. The apparatus also finds use in checking wiring and live circuits in both the home and automobile and checking the spark coil, points and alternator in vehicles. For example, when using the apparatus in automobile tuning, the input probe terminals 34,36 can be connected to opposite sides of the engine points. If the points are open there is a voltage drop on the input probe terminals which is indicated in the manner described above. If on the other hand the engine points are closed, a short circuit exists which also is indicated. In performing tests of this type the provision of the loud speakers 100,132 is particularly advantageous. The opening and closing of the points during engine idling produces a pulsating direct voltage or a modulated-like sound which is indicated audibly by the speakers 100,132. The apparatus also finds use in making fast, in-circuit continuity checks in stereo components, citizens band radios, ordinary radios and television sets. For example, in performing tests on television receivers the input probe terminal 34 can be held near the high voltage section of the television picture tube or the transformer, and the light-emitting diodes 24,24 will light up slightly without any need for contact. The high impedance resistors 56,58 prevent the testing apparatus from loading down devices or circuits being tested.

It is therefore apparent that the present invention accomplishes its intended objects. While a single embodiment of the present invention has been described in detail, this is for the purpose of illustration, not limitation.

I claim:

1. Apparatus for testing electrical voltage and polarity comprising:
   (a) a pair of input probe terminals adapted to be connected to two points having a voltage therebetween to be tested, one of said terminals being connected to an electrical ground or reference of said apparatus;
   (b) a source of direct voltage having a reference terminal connected to said ground or reference of said apparatus, a relatively positive terminal and a relatively negative terminal;

(c) an NPN transistor having base, collector and emitter terminals, said emitter terminals being connected to said reference terminal of said source;

(d) first visual indicating means comprising a light-emitting diode having an anode and a cathode, means for connecting said cathode to said collector of said NPN transistor and means for connecting said anode to said relatively positive source terminal;

(e) a PNP transistor having base, collector and emitter terminals, said emitter terminal being connected to said reference terminal of said source;

(f) second visual indicating means comprising a light-emitting diode having an anode and a cathode, means for connecting said anode to said collector of said PNP transistor and means for connecting said cathode to said relatively negative source terminal; and (g) means for connecting the other of said input probe terminals to each of said bases of said NPN and PNP transistors comprising variable resistance means connected between said other input terminal and said base terminals of said transistors for varying the range of magnitudes of voltage which can be tested;

(h) whereby said apparatus distinguishes between an alternating voltage and a direct voltage across said probe input terminals with both of said light-emitting diodes being energized if said voltage is alternating and with only one of said light-emitting diodes being energized if said voltage is direct, the particular one determined by the polarity of the direct voltage.

2. Apparatus according to claim 1, wherein said means for connecting the other of said input probe terminals includes switching means having first and second positions disconnecting and connecting, respectively, said other input probe terminal to said bases of said transistors.

3. Apparatus according to claim 1, further an including an electroacoustical transducer means connected in series with each of said light-emitting diodes for providing an audible indication of voltage and polarity.

4. Apparatus for testing electrical continuity comprising:

(a) a pair of input probe terminals adapted to be connected to two points between which continuity is to be tested, one of said terminals being connected to an electrical ground or reference of said apparatus;

(b) a source of direct voltage having a reference terminal connected to said ground or reference of said apparatus, a relatively positive terminal and a relatively negative terminal, said source comprising a battery, a first voltage dropping resistor connected between said battery positive terminal and said reference terminal and a second voltage dropping resistor connected between said reference terminal and said battery negative terminal;

(c) switching means including a switch arm and first and second switch contacts, said switching means being manually operable with said switch arm being selectively movable from a neutral position to a position engaging either of said contacts;

(d) first visual indication means comprising a light-emitting diode having an anode and a cathode, means for connecting said cathode to said first switch contact of said switching means and means for connecting said anode to said relatively positive source termina;

(e) second visual indicating means comprising a light-emitting diode having an anode and a cathode, means for connecting said anode to said second switch contact of said switching means and means for connecting said cathode to said relatively negative source terminal; and (f) means for connecting the other of said input probe terminals to said switch arm of said switching means;

(g) whereby if a closed circuit exists between said test points one of said light-emitting diodes is energized when said switch arm is moved into contact with a particular one of said switch contacts, the particular one being determined by the polarity between said test points, and if an open circuit exists between said test points neither of said light-emitting diodes is energized when said switch arm is moved into contact selectively with each of said switch contacts.

5. Apparatus according to claim 4, further including an electroacoustical transducer means connected in series with each of said light emitting diodes for providing an audible indication in response to a closed circuit between said test points.

6. Apparatus for testing electrical voltage, polarity and continuity comprising:

(a) a pair of input probe terminals adapted to be connected to two points to be tested, one of said terminals being connected to an electrical ground or reference of said apparatus;

(b) a source of direct voltage having a reference terminal connected to said ground or reference terminal of said apparatus, a relatively positive terminal and a relatively negative terminal;

(c) an NPN transistor having base, collector and emitter terminals, said emitter terminal being connected to said reference terminal of said source;

(d) first visual indicating means comprising a light-emitting diode having an anode and a cathode, means for connecting said cathode to said collector of said NPN transistor and means for connecting said anode to said relatively positive source terminal;

(e) a PNP transistor having base, collector and emitter terminals, said emitter terminal being connected to said reference terminal of said source;

(f) second visual indicating means comprising a light-emitting diode having an anode and a cathod, means for connecting said anode to said collector of said PNP transistor, and means for connecting said cathode to said relatively negative source terminal;

(g) means for selectively connecting the other of said input probe terminals to each of said bases of said NPN and PNP transistors and individually to said transistor collector terminals; and (h) variable resistor means connected between said other input probe terminal and said base terminals of said transistor for varying the range of magnitudes of voltages which can be tested;

(i) whereby when said other input probe terminal is connected to said transistor bases said apparatus distinguishes between alternating and direct voltages between said probe terminals with both of said light-emitting diodes being energized if said voltage is alternating and with only one of said light-emitting diodes being energized if said voltage is direct, the particular one determined by the polarity of the direct voltage, and when said other input probe terminal is connected individually to said transistor collector terminals said apparatus tests for electrical continuity with a closed circuit between said test points causing one of said light-emitting diodes to be energized, the particular one being determined by the polarity between said test points and with an open circuit between said test points causing neither of said light-emitting diodes to be energized.

7. Apparatus according to claim 6, wherein said selective connecting means comprises a manually-operated multi position selector switch.

8. Apparatus according to claim 6 further including an electroacoustical transducer means connected in series with each of said light-emitting diodes for providing an audible indication of voltage, polarity and continuity.

* * * * *